United States Patent
Elkholy et al.

(10) Patent No.: US 11,552,666 B1
(45) Date of Patent: Jan. 10, 2023

(54) LOW LOSS IMPEDANCE MATCHING CIRCUIT NETWORK HAVING AN INDUCTOR WITH A LOW COUPLING COEFFICIENT

(71) Applicant: Silicon Laboratories Inc., Austin, TX (US)

(72) Inventors: Mohamed M. Elkholy, College Station, TX (US); Francesco Barale, North Kingstown, RI (US); Mustafa H. Koroglu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/362,148

(22) Filed: Jun. 29, 2021

(51) Int. Cl.
*H04B 1/18* (2006.01)
*H03H 7/38* (2006.01)
*H04B 1/04* (2006.01)

(52) U.S. Cl.
CPC .............. *H04B 1/18* (2013.01); *H03H 7/38* (2013.01); *H04B 1/0458* (2013.01)

(58) Field of Classification Search
CPC ........... H04B 1/18; H04B 1/0458; H03H 7/38
See application file for complete search history.

(56) References Cited

U.S. PATENT DOCUMENTS

| | | | |
|---|---|---|---|
| 10,141,971 B1 | 11/2018 | Elkholy et al. | |
| 10,658,999 B1 | 5/2020 | Malla et al. | |
| 2013/0194054 A1* | 8/2013 | Presti | H04B 1/0458 333/32 |
| 2017/0302246 A1* | 10/2017 | Ishizuka | H04B 1/18 |
| 2021/0328606 A1* | 10/2021 | Cui | H04B 1/0057 |
| 2022/0158667 A1* | 5/2022 | Freitas | H02J 50/10 |

* cited by examiner

*Primary Examiner* — Nguyen T Vo
(74) *Attorney, Agent, or Firm* — Nields, Lemack & Frame, LLC

(57) ABSTRACT

A wireless transceiver circuit with an impedance matching network within an integrated circuit is disclosed. In some embodiments, the impedance matching network utilizes an inductor, having two portions, disposed on two different metal layers of the integrated circuit. The first end of the first portion of the inductor is in communication with an antenna. The second end of the second portion is in communication with a low noise amplifier for receiving signals and a power amplifier for transmitting RF signals. The second end of the first portion is connected to the first end of the second portion using a via. In another embodiment, the two portions are disposed on the same metal layer, wherein one portion is disposed within the other with a gap separating the two portions. These configurations require less space than using two separate inductors and also have a low coupling coefficient.

10 Claims, 7 Drawing Sheets

LOW LOSS IMPEDANCE MATCHING CIRCUIT NETWORK HAVING AN INDUCTOR WITH A LOW COUPLING COEFFICIENT

This disclosure describes an impedance matching network and, more particularly, an impedance matching network that utilizes an inductor with low coupling coefficient.

BACKGROUND

Wireless devices typically utilize a wireless transceiver to send and receive wireless data over a wireless network. The wireless transceiver includes circuitry needed to transmit and receive wireless signals.

To transmit data, the transceiver modulates the desired signal with a carrier frequency and amplifies the resulting signal using a power amplifier. This power amplifier is in communication with an antenna. The transceiver may include various components, such as oscillators, filters, mixers and amplifiers, in order to transmit data.

To receive data, the transceiver amplifies the received signal, and demodulates the amplified signal to obtain the wireless signal. The transceiver may include a low noise amplifier (LNA), demodulator, filters and other components, in order to receive the data.

When a single antenna is used, the power amplifier in the transmit portion of the transceiver and the LNA in the receive portion of the transceiver may both be in communication with the antenna.

Impedance matching between the power amplifier and the antenna helps maximize the power delivered to the antenna. This may be achieved by transforming the impedance of the antenna to the required impedance at the output of the power amplifier to achieve the required output power. Similarly, impedance matching between the antenna and the LNA help maximize the power delivered to the LNA. This may be achieved by matching the impedance of the antenna to the input impedance of the LNA.

Since the impedance required at the output of the power amplifier and the input impedance of the LNA may differ, separate impedance matching networks may be used to achieve maximum power efficiency.

FIG. 1 shows one such prior art configuration that may be disposed within a wireless device 10. The antenna 20 is connected to the wireless transceiver circuit 30, which may be disposed within an integrated circuit. The integrated circuit may include a first pad 35 which is used to connect the input of the LNA 31 with components located outside the integrated circuit. A first impedance matching network 50 in in communication with the first pad 35. The first impedance matching network 50 may be used to match the impedance of the antenna, represented as $Z_{ANT}$ to the input impedance of the LNA 31.

Additionally, a second pad 36 may be used to connect the output of the power amplifier 32 with components located outside the integrated circuit. A second impedance matching network 60 is in communication with the second pad 36. The second impedance matching network 60 may be used to transform the impedance of the antenna, represented as $Z_{ANT}$, to the required impedance at the output of the power amplifier 32.

In operation, the wireless transceiver circuit 30 is either in transmit mode or in receive mode. When in receive mode, switch $S_1$ in switching network 40 is closed, while switch $S_2$ is open. When in transmit mode, the switch $S_2$ is closed while switch $S_1$ is open.

For energy-efficient transceivers, the first impedance matching network 50 may be a step-up matching network working as a passive voltage amplifier in front of the LNA 31 to minimize the required transconductance ($g_m$) of the LNA 31, thereby achieving a low noise figure (NF). Reducing $g_m$ of the LNA 31 implies that the LNA 31 needs less DC current, reducing the power consumption of the receiver (RX). In some embodiments, the first impedance matching network 50 may be implemented as a series inductor to resonate with the input capacitance of the LNA 31.

The design of the second impedance matching network 60 may depend on the maximum output power of the PA. For example, the second impedance matching network 60 may be a pi-network of C-$L_2$-C to transform the antenna impedance to the desired resistance at the output of power amplifier 32 ($R_{PA}$). The maximum output power of the power amplifier 32 is determined by its supply ($V_{ddpA}$) and $R_{PA}$. For a class D power amplifier, the maximum output power is calculated as:

$$P_{max} \approx \frac{2}{\pi^2} \frac{V_{ddPA}^2}{R_{PA}}$$

Utilizing external impedance matching circuits allows higher quality factor inductors to minimize the insertion loss of the matching network. However, these external components increase the amount of space needed and also increase cost.

FIG. 2 shows a prior art configuration that incorporates the impedance matching network within the integrated circuit. In this embodiment, the LNA 131, the power amplifier 132 and the impedance matching network are all disposed within the wireless transceiver circuit 130, which is disposed within integrated circuit. The LNA 131 and the power amplifier 132 are connected to a shared node. A pad 135 is used to allow connection of the antenna 120 to the on-chip impedance matching network. Thus, the impedance matching network is disposed between the pad 135 and the shared node.

In certain embodiments, the impedance matching network is configured as two step-up L-networks, each comprising a capacitor and an inductor. Thus, one L-network comprises series inductor $L_3$ and shunt capacitor $C_1$, and the second L-network comprises series inductor $L_4$ and shunt capacitor $C_2$.

Because the impedance of the impedance matching network is different for transmission and reception, at least one of the components must be variable. In the configuration shown in FIG. 2, the shunt capacitors, $C_1$ and $C_2$ are both tunable. For example, these capacitors may be in communication with a control circuit 170 that is capable of adjusting the values of $C_1$ and $C_2$.

Thus, in receive mode, the control circuit 170 manipulates the shunt capacitors so that the antenna impedance ($Z_{ANT}$) matches the input resistance of the LNA 131. In transmit mode, the control circuit 170 manipulates the shunt capacitors so that the antenna impedance ($Z_{ANT}$) matches the output resistance of the power amplifier 132.

In certain embodiments, the input resistance of the LNA 131 may be 300Ω or more. In certain embodiments, in receive mode, where LNA 131 is enabled and the power amplifier 132 is disabled, $C_1$ is set to minimum capacitance to maximize voltage gain before the LNA 131, so as to minimize the noise figure of the LNA 131. If $C_1$ is set to a minimum value, it may be ignored such that the $L_3+L_4$ and $C_2$ form a single L-network to step-up $Z_{ANT}$ to $R_{LNA}$.

The resistance of the receive mode, which is the maximum resistance, may be defined as:

$$R_{max} = Re(Z_{ANT})*(1+Q_{max}^2), \text{ where}$$

$$Q_{max} = \frac{\omega_0*(L_3+L_4) + Im(Z_{ANT})}{Re(Z_{ANT})},$$

where $Q_{max}$ is the quality factor of the matching network in receive mode setting.

Thus, for a center frequency of about 2.45 GHz, a desired maximum resistance of 300Ω, and an antenna impedance of 50Ω, $Q_{max}$ is roughly 2.23 and $L_3+L_4$ is in the range of 7-8 nH.

Further, the capacitance of $C_2$ in this configuration is defined as:

$$C_{2,max} = \frac{Q_{max}}{\omega_0 * R_{max}}$$

Thus, $C_{2,max}$ is in the range of 500 fF.

The impedance matching network may achieve its minimum resistance during transmit mode. It is preferable to see real resistance $R_{PA}$ at the output of the power amplifier 132 to achieve maximum efficiency for the power amplifier 132. Assuming $V_{ddPA}$ as 1.2 V and $P_{max}$ of 3 dBm (extra 2 dB to compensate the insertion loss of the matching network and 1 dB for non-ideal operation of class D power amplifier), $R_{PA}$ should be 145Ω approximately. $L_3$, $L_4$ and $C_1$ values will determine $R_{PA}$ value. As described above, $L_3+L_4$ is defined by receive mode; therefore $C_1$ and $L_3$ are used to determine $R_{PA}$.

For minimum insertion loss, the matching network may be designed using two step-up L-networks. This circuit may be evaluated in series, looking first at the first stage L-network, closest to the antenna. In this case, $L_3$ and $C_{1,opt}$ form an L-network transforming $Z_{ANT}$ to an intermediate real shunt resistance $R_{3,opt}$. $R_{3,opt}$ can be calculated as:

$$R_{3,opt} = Re(Z_{ANT})*(1+Q_3^2), \text{ where}$$

$$Q_3 = \frac{\omega_0*L_3 + Im(Z_{ANT})}{Re(Z_{ANT})}$$

The optimal value for $C_1$ can be calculated as:

$$C_{1,opt} = \frac{Q_3}{\omega_0 * R_{3,opt}} = \frac{\omega_0 L_3 + Im(Z_{ANT})}{\omega_0 * [(Re(Z_{ANT}))^2 + (\omega_0 L_3 + Im(Z_{ANT}))^2]}$$

Similarly, the second stage L-network may be evaluated as follows:

$$R_{4,opt} = R_{3,opt}*(1+Q_4^2), \text{ where}$$

$$Q_4 = \frac{\omega_0 * L_4}{R_{3,opt}}$$

The optimal value for $C_2$ can be calculated as:

$$C_{2,opt} = \frac{Q_4}{\omega_0 * R_{4,opt}} = \frac{\omega_0 L_4}{\omega_0 * [R_{3,opt}^2 + (\omega_0 L_4)^2]} = \frac{L_4}{R_{3,opt}^2 + (\omega_0 L_4)^2}$$

Thus, the input impedance can be given by:

$$R_{PA} = R_{4,opt} = R_{3,opt}*(1+Q_4^2) = R_{3,opt} + \frac{(\omega_0 L_4)^2}{R_{3,opt}},$$

As described above, the sum of $L_3$ and $L_4$ is given by the maximum input impedance in receive mode. The individual values for $L_3$ and $L_4$ may be determined based on the desired output impedance in transmit mode. By using the previous equations, $R_{3,opt}$ can be deduced from $Re(Z_{ANT})$, $R_{max}$ and $R_{4,opt}$:

$$\sqrt{\frac{R_{3,opt}}{Re(Z_{ANT})} - 1} + \frac{R_{3,opt}}{Re(Z_{ANT})} * \sqrt{\frac{R_{4,opt}}{R_{3,opt}} - 1} = \sqrt{\frac{R_{max}}{Re(Z_{ANT})} - 1}$$

which can be solved numerically.

When the circuit of FIG. 2 is designed in an integrated circuit, the resulting layout may be as shown in FIG. 3. $L_3$ is shown on the left and may be an octagonal coil disposed on an upper metal layer of the integrated circuit. In this embodiment, $L_3$ has an inductance of 2.6 nH and 3.5 turns. $L_3$ may have an inner diameter of at least 80 μm and an outer diameter of 120 μm. This configuration is based on the following parameters: a center frequency of 2.45 GHz, $R_{ANT}$ of 50Ω), $R_{PA}$ of 145Ω, and $R_{LNA}$ of 300Ω. $L_4$ is shown on the right and may also be an octagonal coil disposed on an upper metal layer of the integrated circuit. In this embodiment, $L_4$ has and inductance of 4.7 nH and 4.5 turns. $L_4$ may also have an inner diameter of at least 80 μm and may have an outer diameter of 135 μm. This configuration is based on the parameters described above. Of course, other dimensions are also possible. A metal trace 180 may be used to connect $L_3$ and $L_4$. If $L_3$ and $L_4$ are both disposed on the higher metal layer, the metal trace 180 that connects them may be on the lower metal layer. Vias 181, 182 may be used to connect the metal trace 180 to the two inductors. $C_1$ is also in communication with this metal trace 180. $C_2$ may be disposed near the LNA and power amplifier. A second metal trace 185 may be used to connect $L_4$ to the LNA and power amplifier. Note that the use of two inductors requires a large amount of space within the integrated circuit.

FIG. 4 shows an enhancement to the design shown in FIG. 2. The wireless device 200 comprises a wireless transceiver circuit 230 having a LNA 231 and a power amplifier 232. As described above, a pad 235 is used to connect the wireless transceiver circuit 230 to the external antenna 220. A control circuit 270 may be used to manipulate $C_2$ and $C_3$.

In this figure, a single inductor $L_5$ having the total inductance of the two inductors, $L_3$ and $L_4$, is used. A first shunt capacitor, $C_3$ is connected to one of the coils in $L_5$, as shown in FIG. 5. $C_3$ may be referred to as a center tap capacitor. By utilizing a single inductor, $L_5$, the space required for the impedance matching network may be reduced. As shown in FIG. 5, the inductor $L_5$ may be a plurality of octagonal coils disposed on an upper metal layer of the integrated circuit. In this embodiment, $L_5$ has an inductance of 7.3 nH and 7.5 turns. $L_5$ may have an inner diameter of at least 80 μm and an outer diameter of 155 μm. $C_3$ may be connected to $L_5$ using a via 190 located on a lower metal layer. $C_2$ may be disposed near the LNA and power amplifier. A metal trace 195, disposed on the lower metal layer may be used to connect $L_5$ to $C_2$, the LNA and the power amplifier. Note that the use of a single inductor requires about 50% less space than the configuration shown in FIGS. 2-3 due to wasted area in the space between the two inductors.

However, the quality factor of this design is reduced as compared to the configuration shown in FIGS. 2-3. Specifically, FIG. 6A shows the configuration of the single inductor $L_5$ and center tap capacitor $C_3$. FIG. 6B shows an equivalent representation of this circuit, where the inductor $L_5$ is divided into two portions $L_{5a}$ and $L_{5b}$. $L_{5a}$ is defined as that part of the inductor $L_5$ between the pad and the node that connects to $C_3$. $L_{5b}$ is defined as that part of the inductor $L_5$ between the node that connects to $C_3$ and the node that connects to $C_2$. Note that there is mutual inductance between $L_{5a}$ and $L_{5b}$ due to the proximity of $L_{5a}$ to $L_{5b}$. This mutual inductance (M) can be modeled as an additional inductance on $L_{5a}$ and $L_{5b}$. This mutual inductance also appears as a negative inductance (−M) on the shunt path.

It can be seen that the shunt path in FIG. 6C that includes −M and $C_3$ is equivalent to the shunt path in FIG. 2 that includes $C_1$. Thus, $$\frac{1}{s*C_1} = -M*s + \frac{1}{s*C_3}, \text{ or } C_3 = \frac{C_1}{1-\omega_0^2 C_1 M}$$

At very small values of $C_1$, the denominator of the above equation is approximately 1, so $C_3$ very nearly equals $C_1$. However, at larger values of $C_1$, this is not true. Assume a coupling coefficient between $L_{5a}$ and $L_{5b}$ of 0.56. This results in a mutual inductance of M=1.22 nH. For a value of $C_1$ of 0.634 pF, $C_3$ would be 0.776 pF, an increase of 22% in the required range of $C_3$ as compared to $C_1$. This translates to a decrease in quality factor of $C_3$ of 22% to achieve the same minimum capacitance as $C_1$ in the topology of FIG. 2.

Thus, it would be advantageous if there were an impedance matching network that did not require the space consumed by the configuration shown in FIG. 3, but had a quality factor that was higher than the configuration shown in FIG. 5. Further, it would be beneficial if this new impedance matching network could be readily incorporated into an integrated circuit design.

SUMMARY

A wireless transceiver circuit with an impedance matching network within an integrated circuit is disclosed. In some embodiments, the impedance matching network utilizes an inductor, having two portions, disposed on two different metal layers of the integrated circuit. The first end of the first portion of the inductor is in communication with an antenna. The second end of the second portion is in communication with a low noise amplifier for receiving signals and a power amplifier for transmitting RF signals. The second end of the first portion is connected to the first end of the second portion using a via. A tunable capacitor is also connected to the via that connects the two portions. A second tunable capacitor is connected to the second end of the second portion. In another embodiment, the two portions are disposed on the same metal layer, wherein one portion is disposed within the other with a gap separating the two portions. These configurations require less space than using two separate inductors and also have a low coupling coefficient.

According to one embodiment, an impedance matching network implemented using an integrated circuit is disclosed. The impedance matching network comprises an inductor comprising a first portion disposed on a first metal layer of the integrated circuit and a second portion disposed on a second metal layer, different from the first metal layer, wherein a first end of the first portion is in communication with an antenna, a second end of the first portion is connected to a first end of the second portion using a via, and a second end of the second portion is in communication with a shared node; a first tunable capacitor connected to the via; and a second tunable capacitor connected to the shared node. In some embodiments, the coupling coefficient between the first portion and the second portion is less than 0.4. In some embodiments, the coupling coefficient between the first portion and the second portion is less than 0.35. In certain embodiments, real estate used on the first metal layer for the first portion overlaps real estate used on the second metal layer for the second portion. In some embodiments, the first portion and the second portion comprise a plurality of connected octagonal coils. In certain embodiments, an offset between a center of the first portion and a center of the second portion is at least 40 µm. In some embodiments, an innermost octagonal coil of the first portion is vertically aligned with the outermost octagonal coil of the second portion. In certain embodiments, the first metal layer is below the second metal layer. In some embodiments, trace widths for the second portion are narrower than trace widths for the first portion.

According to another embodiment, a wireless transceiver is disclosed. The wireless transceiver comprises the impedance matching network described above; a low noise amplifier to receive signals from an antenna during a receive mode; and a power amplifier to transmit signals to the antenna during a transmit mode, wherein the low noise amplifier and the power amplifier connect to the shared node.

According to another embodiment, an impedance matching network implemented using an integrated circuit is disclosed. The impedance matching network comprises an inductor comprising a first portion disposed on a first metal layer of the integrated circuit and a second portion disposed on the first metal layer and contained within the first portion and separated from the first portion by a separation distance, wherein a second end of the first portion is connected to a first end of the second portion, wherein a first end of the first portion or a second end of the second portion is connected to a shared node; a first tunable capacitor connected to the second end of the first portion; and a second tunable capacitor connected to the shared node. In some embodiments, the coupling coefficient between the first portion and the second portion is less than 0.4. In some embodiments, the coupling coefficient between the first portion and the second portion is less than 0.35. In some embodiments, the first portion and the second portion comprise a plurality of connected octagonal coils. In certain embodiments, the separation distance is at least 10 µm. In some embodiments, the first end of the first portion is connected to an antenna and the second end of the second portion is connected to the shared node. In certain embodiments, the first end of the first portion is connected to the shared node and the second end of the second portion is connected to the antenna.

According to another embodiment, a wireless transceiver is disclosed. The wireless transceiver comprises the impedance matching network described above wherein the first end of the first portion is connected to an antenna and the second end of the second portion is connected to the shared node; a low noise amplifier to receive signals from the antenna during a receive mode; and a power amplifier to transmit signals to the antenna during a transmit mode, wherein the low noise amplifier and the power amplifier connect to the shared node.

According to another embodiment, a wireless transceiver is disclosed. The wireless transceiver comprises the impedance matching network described above wherein the first end of the first portion is connected to the shared node and the second end of the second portion is connected to an antenna; a low noise amplifier to receive signals from the antenna during a receive mode; and a power amplifier to transmit signals to the antenna during a transmit mode, wherein the low noise amplifier and the power amplifier connect to the shared node.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
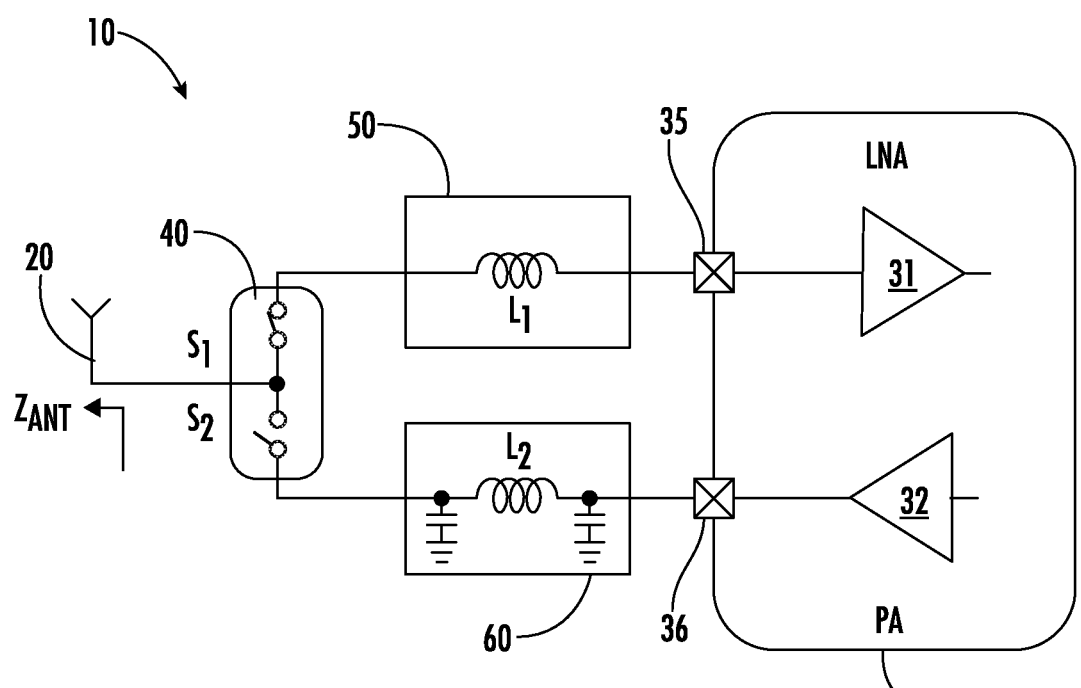
FIG. 1 is a block diagram of a prior art wireless device with of-chip impedance matching networks.
Figure 2:
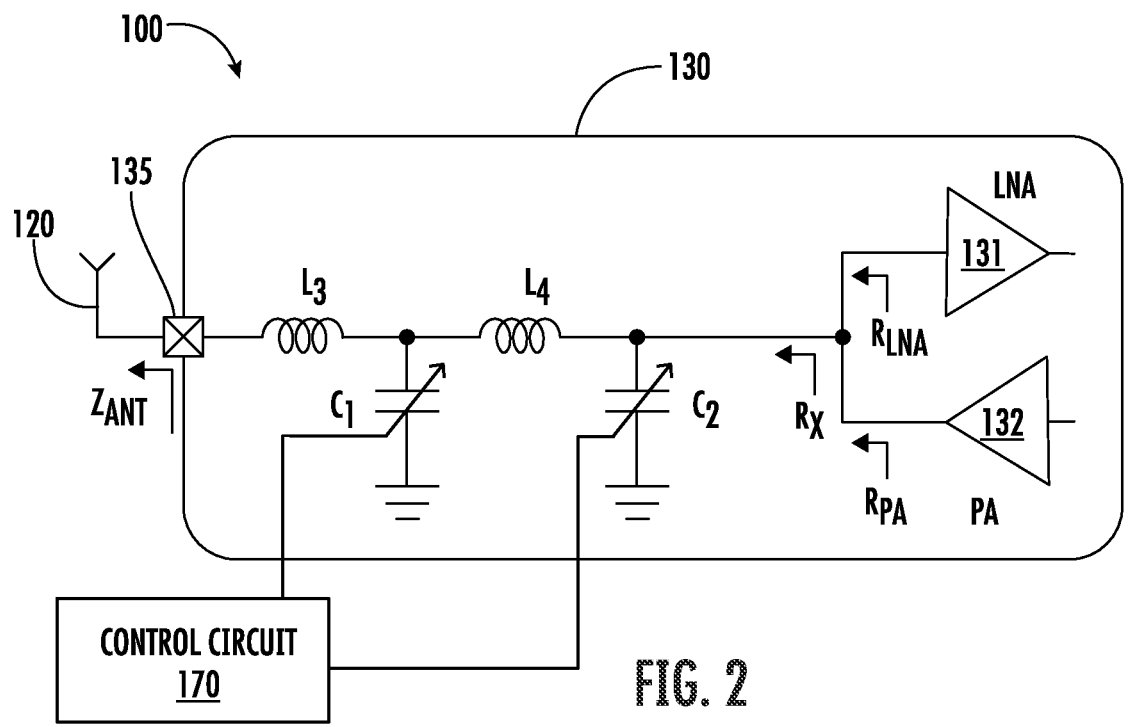
FIG. 2 is a block diagram of a prior art wireless device with a single on-chip impedance matching network that utilizes two inductors.
Figure 4:
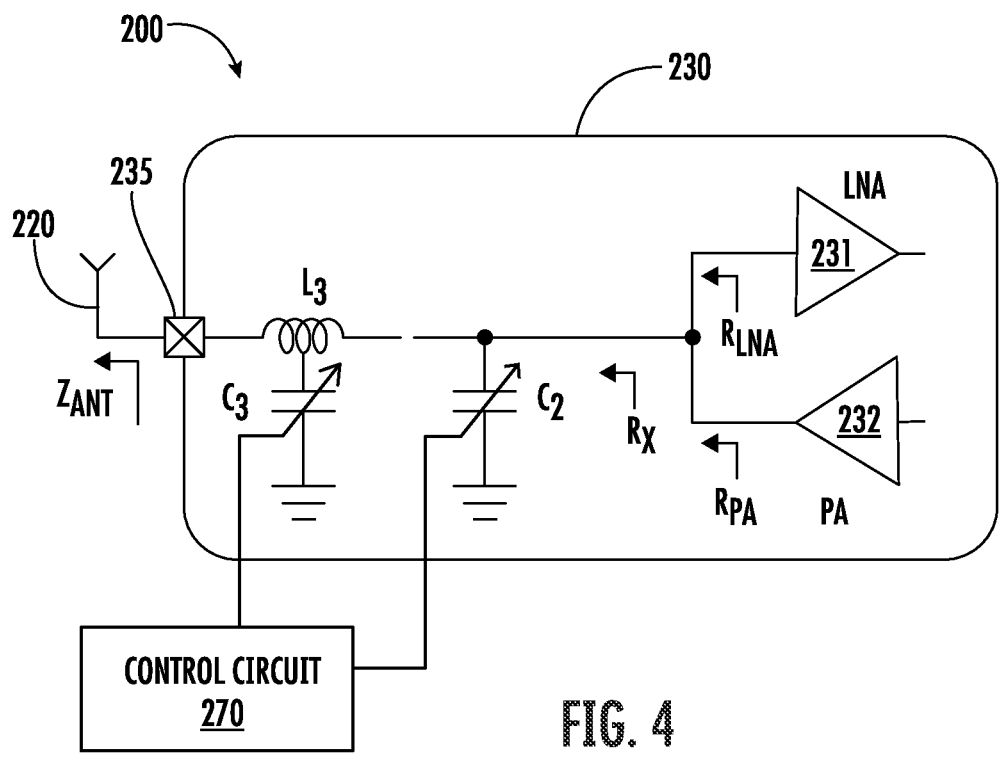
FIG. 4 is a block diagram of a prior art wireless device with a single on-chip impedance matching network that utilizes a single inductor.
Figure 5:
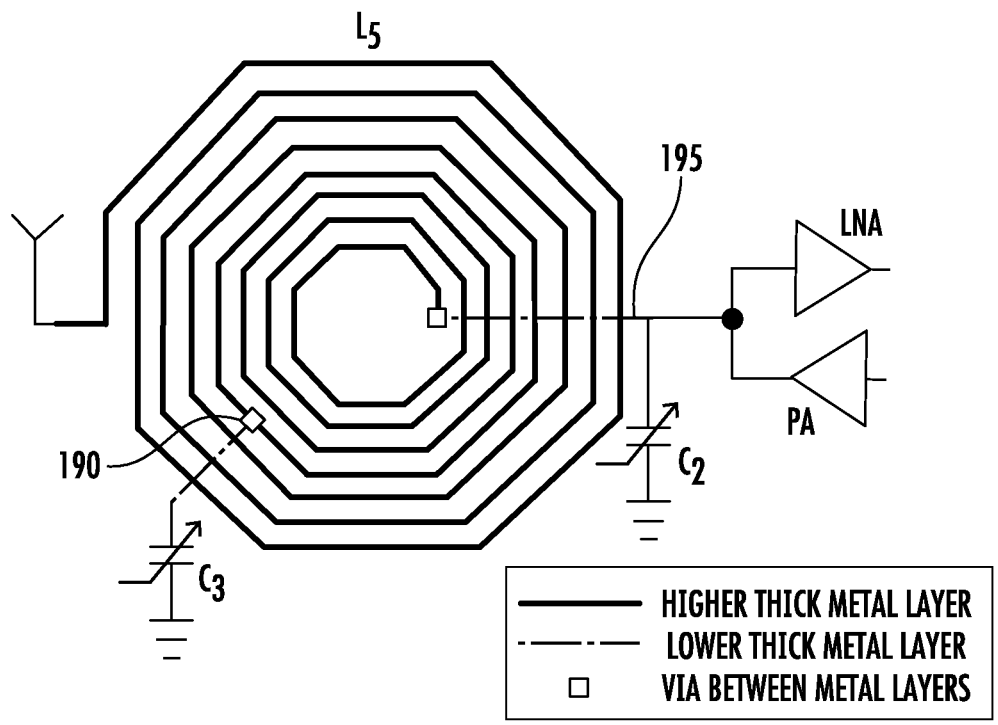
FIG. 5 is a representative schematic diagram showing the layout of the impedance matching network of FIG. 4.
Figure 6C:
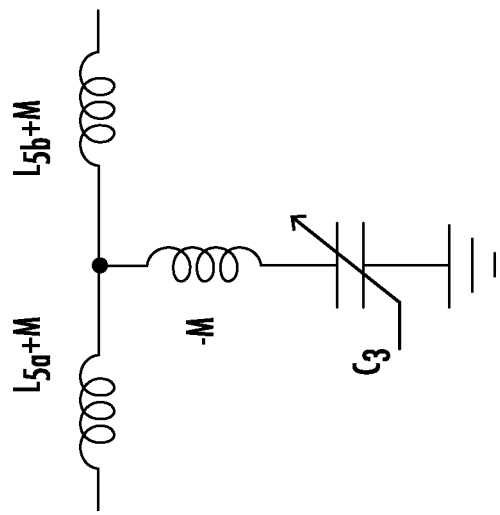
FIG. 6A-6C are equivalent circuits for the impedance matching network of FIG. 4.
Figure 6B:
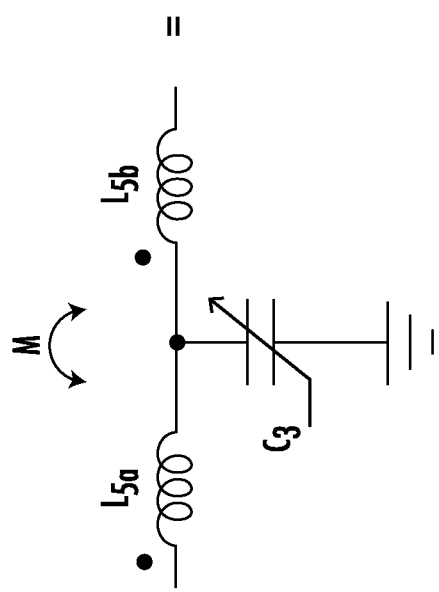
Figure 6A:
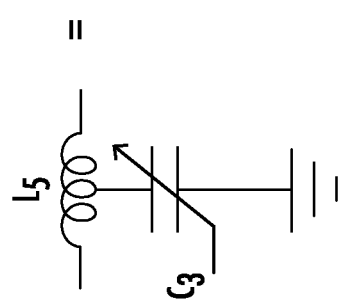

As described above, the impedance matching network shown in FIGS. 4-5 consumes less space within the integrated circuit than the impedance matching network of FIG. 2. However, as noted above, the quality factor of the impedance matching network of FIGS. 4-5 is degraded as compared to the impedance matching network of FIG. 2. Specifically, due to the use of an inductor with a center tap capacitor in FIG. 5, there is a large coupling coefficient between the two portions of the inductor $L_5$.

Coupling coefficient refers to the interaction between two inductors, and is in the range from 0 to 1. The closer two inductors are located to one another, the larger the coupling coefficient, assuming all other factors remain constant. Coupling coefficient is defined as:

$$k = \frac{M}{\sqrt{L_1 * L_2}}$$

where k is coupling coefficient, M is mutual inductance and $L_1$ and $L_2$ are the two inductance values.

Figure 3:
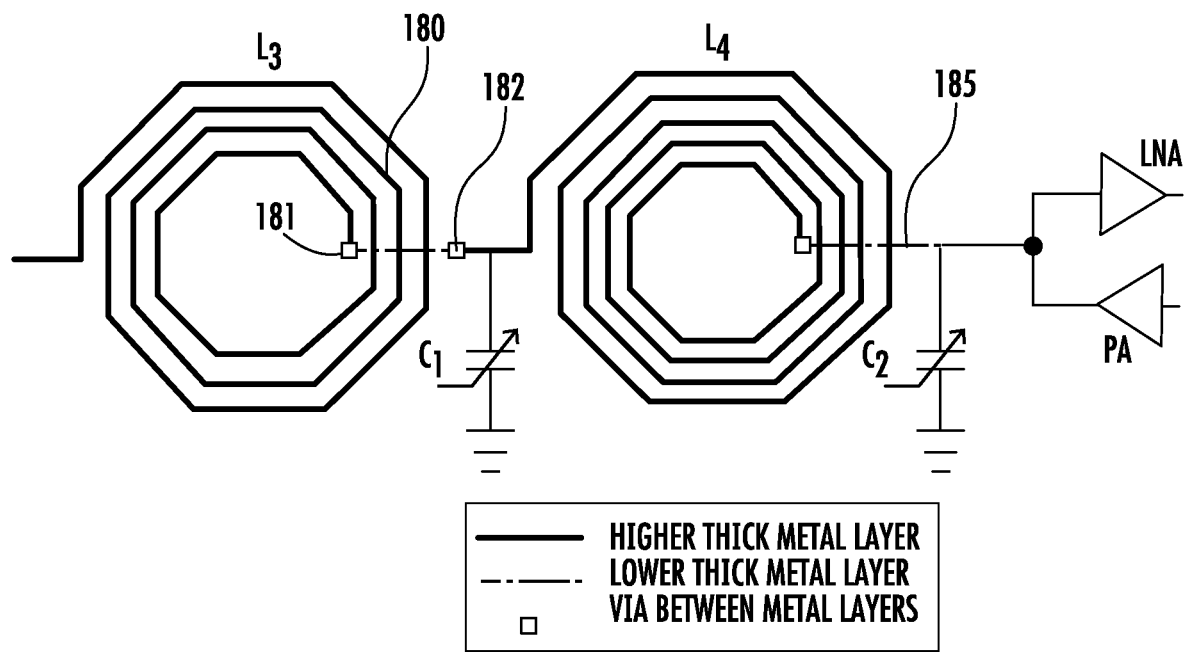
FIG. 3 is a representative schematic diagram showing the layout of the impedance matching network of FIG. 2.

For example, the coupling coefficient between the inductors $L_2$, $L_4$ in FIG. 3 may be about 0.1 or less. In contrast, the coupling coefficient between the two portions of $L_5$ in FIG. 5 may be about 0.5 to 0.6.

As shown in the above equation, the larger the coupling coefficient is, the greater the mutual inductance (M).

Thus, reduction of the coupling coefficient for the two portions of the inductor $L_5$ would reduce the range of values required for $C_3$, which in turn, improves the quality factor. One approach to reduce coupling coefficient is to dispose the two portions of the inductor $L_5$ on two different metal layers of the integrated circuit. Specifically, FIG. 5 shows that the entirety of the inductor $L_5$ is disposed on the higher metal layer. By separating the inductor into two portions and disposing these two portions on different metal layers, the coupling coefficient may be reduced. For example, the first portion of the inductor $L_5$, referred to $L_{5a}$, may be disposed on a lower metal layer within the integrated circuit. The first portion $L_{5a}$ is in communication with the antenna. The second portion of the inductor $L_5$, referred to as $L_{5b}$, may be disposed on an upper metal layer within the integrated circuit. The second portion $L_{5b}$ is in communication with the LNA and the power amplifier.

It may be beneficial to dispose the first portion $L_{5a}$ on the lower metal layer, as this metal layer may have higher coupling to the substrate. Since the first portion $L_{5a}$ is part of the first L-network which has lower impedance (i.e. $Z_{ANT}$), it is less affected by any resistive or capacitive coupling to the substrate. Additionally, to minimize the series resistance of the inductor $L_5$, it may be beneficial to use wider trace widths for the first portion $L_{5a}$.

Conversely, the second portion $L_{5b}$ is part of a second L-network that has a higher impedance due to its connection to the LNA and power amplifier. Therefore, the second portion $L_{5b}$ may be more affected by substrate coupling. Thus, the second portion $L_{5b}$ may be disposed on a higher metal layer than the first portion $L_{5a}$. Additionally, the trace widths for the second portion $L_{5b}$ may be narrower than the trace widths of the first portion $L_{5a}$ since the impedance of the second portion $L_{5b}$ is more sensitive to substrate coupling.

Further, center tap capacitor $C_3$ may be connected to the via that connects the first portion $L_{5a}$ to the second portion $L_{5b}$.

In each of the embodiments described, the wireless device is implemented as an integrated circuit, wherein the LNA and power amplifier are connected to a shared node. An antenna is in communication with a pad of the integrated circuit. The impedance matching network is disposed between the pad and the shared node.

Figure 7:
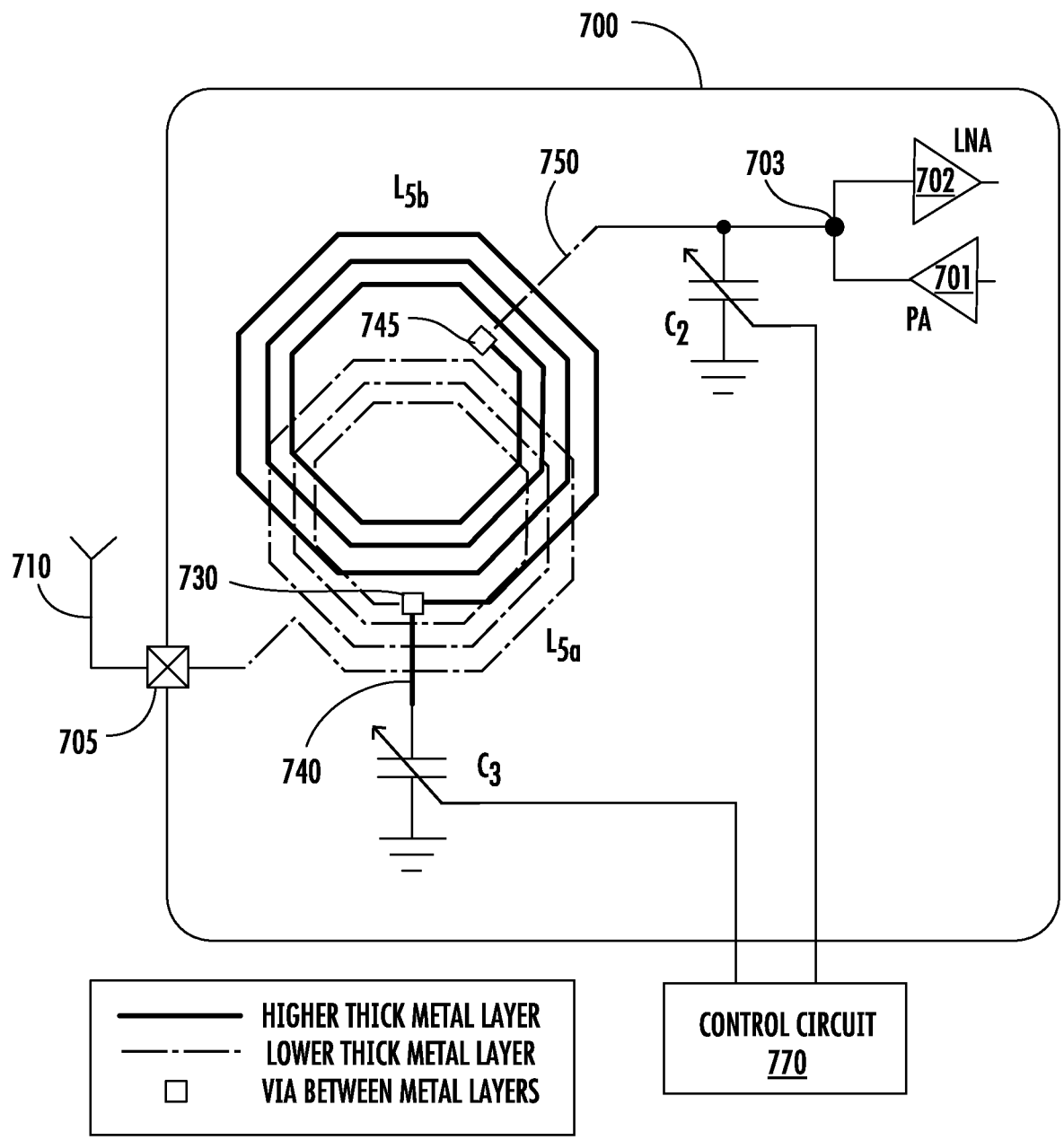
FIG. 7 is a representative schematic diagram showing the new layout of the impedance matching network according to a first embodiment.

In FIG. 7, the transceiver circuit 700 is disposed within an integrated circuit. The transceiver circuit 700 is in communication with an antenna 710 through a pad 705. Low noise amplifier 702 and power amplifier 701 are within the transceiver circuit 700 and both connect to a shared node 703. The outermost coil of the first portion $L_{5a}$ is in electrical contact with the pad 705.

In this embodiment, the first portion $L_{5a}$ and the second portion $L_{5b}$ are offset from one another in one direction. In one particular embodiment, the offset between the centers of the first portion $L_{5a}$ and the second portion $L_{5b}$ is about 40 µm. Of course, in certain embodiments, the offset may be greater than this value. In other embodiments, the offset may be less than this value. In one embodiment, $L_{5a}$ may have an inner diameter of 90 μm and an outer diameter of 135 μm, while $L_{5b}$ may have an inner diameter of 90 μm and an outer diameter of 145 μm.

Assume the direction upward from the center of first portion $L_{5a}$ is defined as 0°, and the direction to the right of the center of first portion $L_{5a}$ is defined as 90°. Thus, in this embodiment, the center of the second portion $L_{5b}$ is offset from the center of the first portion $L_{5a}$ at an angle of 0°.

In this embodiment, both portions are created using a plurality of connected octagonal coils. The center of each portion may be defined as follows. A normal line may be drawn from the midpoint of each segment of each octagonal coil. The point at which all of these normal lines intersect is the center of the portion. The locations at which the octagonal coils are closest to the center may be referred to as the inner diameter. The locations at which the octagonal coils are furthest from the center may be referred to as the outer diameter.

In this embodiment, a via 730 connects the first portion $L_{5a}$ to the second portion $L_{5b}$. Note that the innermost coil of the first portion $L_{5a}$ is aligned in the height direction with the outermost coil in the second portion $L_{5b}$. In this way, the connection between the first portion $L_{5a}$ and the second portion $L_{5b}$ is a vertical via. $C_3$ is connected to via 730 using metal trace 740, which may be disposed on the higher metal layer.

For the innermost coil of the first portion $L_{5a}$ to vertically connect to the outermost coil of the second portion $L_{5b}$, the centers of the two portions $L_{5a}$, $L_{5b}$ may be offset by a distance equal to the difference between the outer radius of the second portion and the inner radius of the first portion. If the offset is equal to this difference, the two portions may be connected using only a vertical via. If the offset is greater or less than this difference, the two portions may be connected by a vertical via and a metal trace.

The innermost coil of the second portion $L_{5b}$ is connected to the shared node 703 using second metal trace 750, which is disposed on the lower metal layer. In certain embodiments, this is the same metal layer that the first portion $L_{5a}$ is disposed on. A second via 745 is used to connect the innermost coil of the second portion $L_{5b}$, which may be disposed on an upper metal layer, to the second metal trace 750. Capacitor $C_2$ is also connected to second metal trace 750.

A control circuit 770 may be in communication with $C_2$ and $C_3$. As described above, these capacitors are tunable. In certain embodiments, the control circuit may be a digitally controlled capacitor array, comprising a plurality of capacitors that are arranged in parallel, wherein the control circuit may enable one or more of these parallel capacitors to achieve the desired capacitance for $C_2$ and $C_3$. In certain embodiments, the specific capacitor values may be stored in the control circuit as digital bytes, where each bit denotes whether a specific capacitor should be enabled or remain disabled.

While FIG. 7 shows the two portions $L_{5a}$, $L_{5b}$ offset in the vertical direction (or 0°), the two portions may also be offset in the horizontal direction. This may be achieved, for example, by rotating the layout shown in FIG. 7 by 90°.

The values of $L_{5a}$ and $L_{5b}$ and the minimum and maximum values for $C_2$ and $C_3$ may be determined using the equations recited above, which utilize $Z_{ANT}$, $R_{max}$, $R_{PA}$, M, and $\omega_0$.

Figure 8:
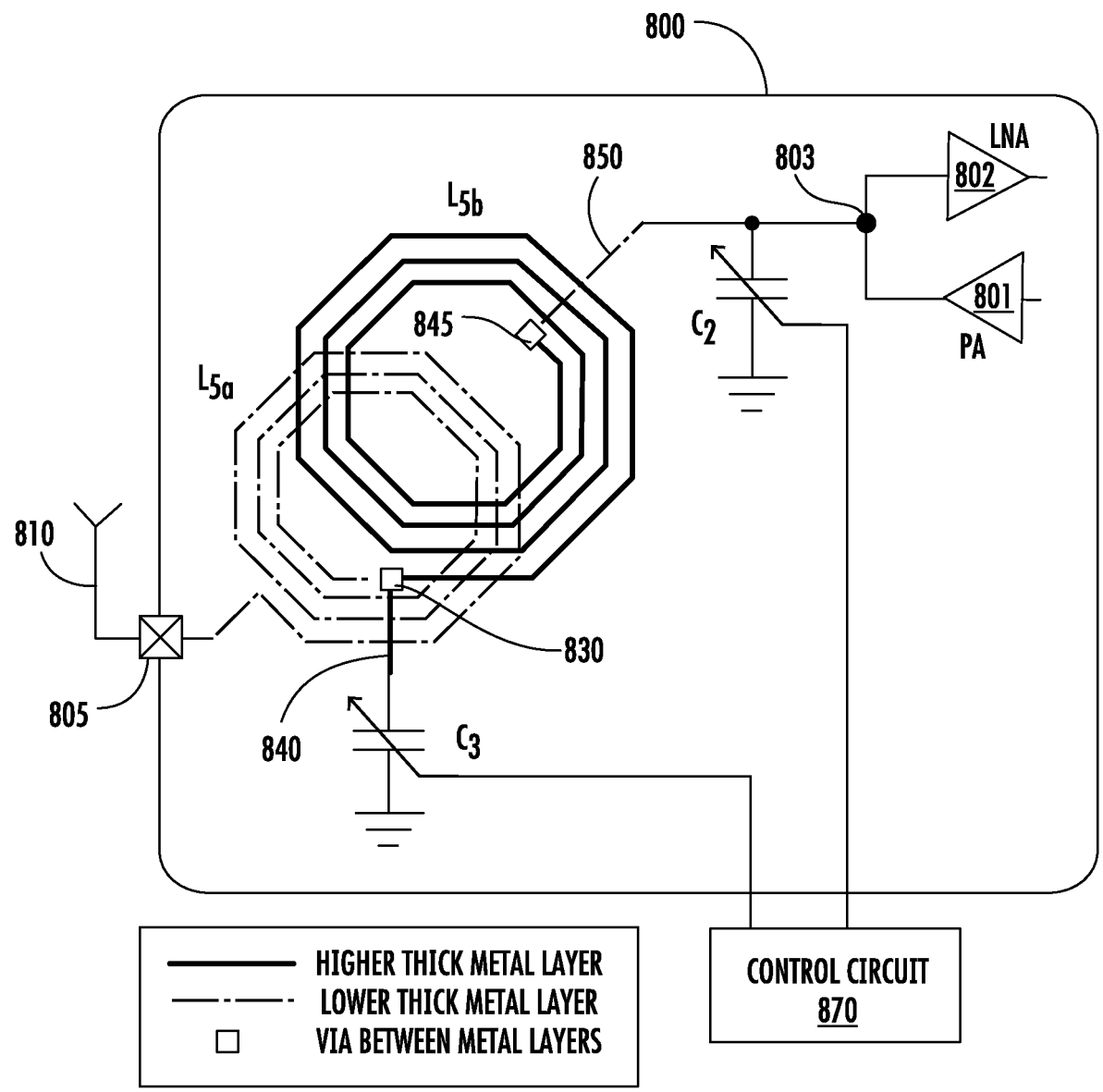
FIG. 8 is a representative schematic diagram showing the new layout of the impedance matching network according to a second embodiment.

FIG. 8 shows another embodiment of the present disclosure. The transceiver circuit 800 is disposed within an integrated circuit. The transceiver circuit 800 is in communication with an antenna 810 through a pad 805. Low noise amplifier 802 and power amplifier 801 are within the transceiver circuit 800 and both connect to a shared node 803. The outermost coil of the first portion $L_{5a}$ is in electrical contact with the pad 805.

In this embodiment, the center of the first portion $L_{5a}$ and the center of the second portion $L_{5b}$ are offset in two directions. In FIG. 8, the center of the second portion $L_{5b}$ is offset from the center of the first portion $L_{5a}$ at an angle of 45°.

In this embodiment, a via 830 connects the first portion $L_{5a}$ to the second portion $L_{5b}$. Note that the innermost coil of the first portion $L_{5a}$ is aligned in the height direction with the outermost coil in the second portion $L_{5b}$. In this way, the connection between the first portion $L_{5a}$ and the second portion $L_{5b}$ is a vertical via. Of course, the connection may be created using a trace and a via in embodiments where the innermost coil of the first portion $L_{5a}$ and the outermost coil of second portion $L_{5b}$ are not vertically aligned. $C_3$ is connected to via 830 using metal trace 840, which is disposed on the higher metal layer.

The innermost coil of the second portion $L_{5b}$ is connected to the shared node 803 using second metal trace 850, which is disposed on the lower metal layer. In certain embodiments, this is the same metal layer that the first portion $L_{5a}$ is disposed on. A second via 845 is used to connect the innermost coil of the second portion $L_{5b}$, which may be disposed on an upper metal layer, to the second metal trace 850. Capacitor $C_2$ is also connected to second metal trace 850.

A control circuit 870 may be in communication with $C_2$ and $C_3$. This control circuit 870 may be similar to that described with respect to FIG. 7.

As described above, for the innermost coil of the first portion $L_{5a}$ to connect to the outermost coil of the second portion $L_{5b}$ the centers of the two portions $L_{5a}$, $L_{5b}$ may be offset by a distance equal to the difference between the outer radius of the second portion and the inner radius of the first portion. If the offset is equal to this difference, the two portions may be connected using only a vertical via. If the offset is greater or less than this difference, the two portions may be connected by a vertical via and a metal trace. In this embodiment, the centers of the two portions may be offset by 40 μm.

Thus, in the embodiments shown in FIGS. 7-8, the inductor $L_5$ comprises two portions, $L_{5a}$ and $L_{5b}$, which are disposed on different metal layers within the integrated circuit. In certain embodiments, the two portions of the inductor at least partially overlap one another. In other words, the real estate used on one metal layer to implement one portion of the inductor at least partially overlaps the real estate used on a different metal layer to implement the second portion of the inductor. In certain embodiments, either the first portion $L_{5a}$ or the second $L_{5b}$ may be completely within the real estate used for the other portion. In other embodiments, the first and second portion only partially overlap, as shown in FIGS. 7-8.

Figure 9:
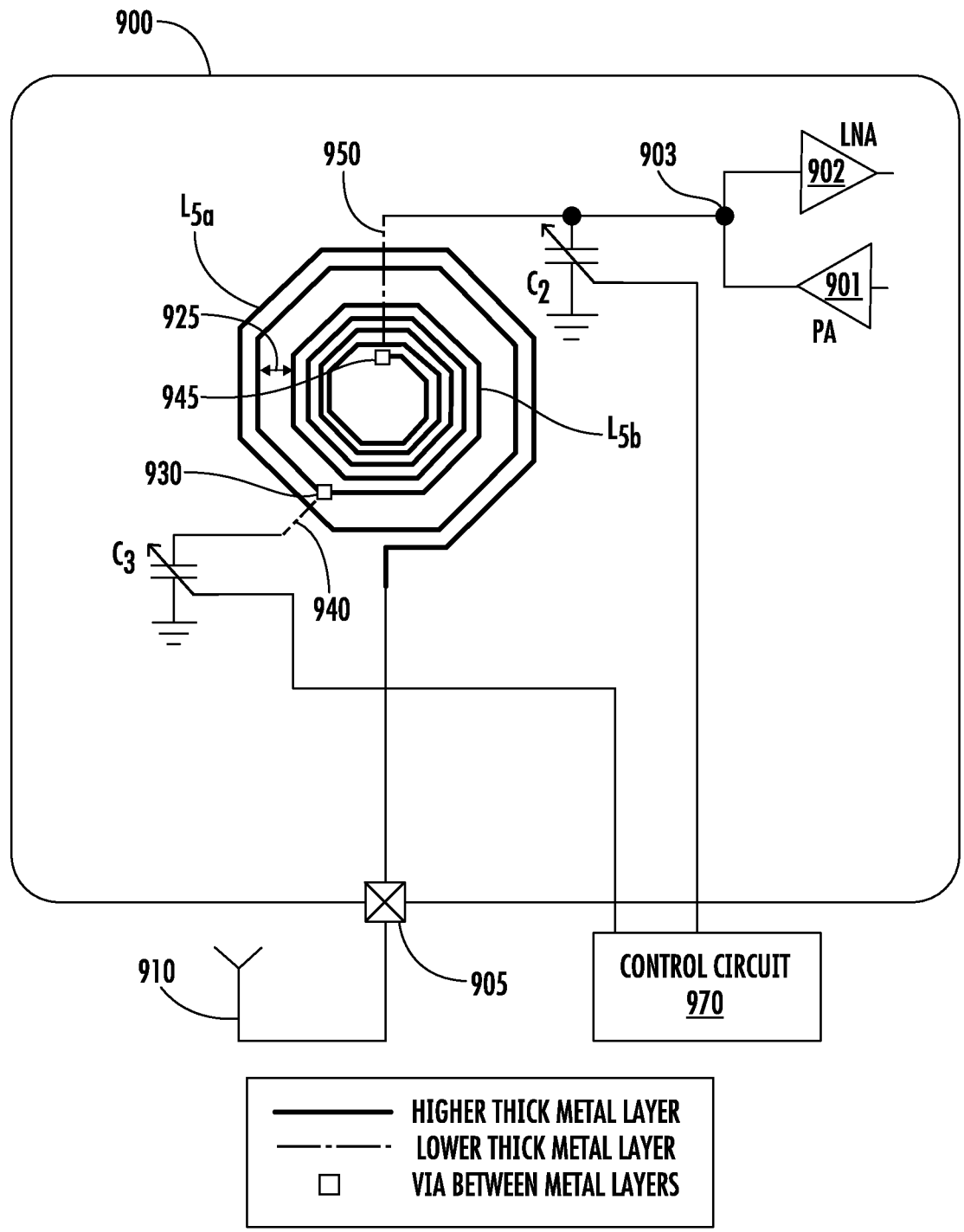
FIG. 9 is a representative schematic diagram showing the new layout of the impedance matching network according to a third embodiment.

Of course, other configurations may be utilized to reduce the coupling coefficient. One such configuration is shown in FIG. 9. The transceiver circuit 900 is in communication with an antenna 910 through a pad 905. Low noise amplifier 902 and power amplifier 901 are within the transceiver circuit 900 and both connect to a shared node 903. The outermost coil of the first portion $L_{5a}$ is in electrical contact with the pad 905.

In this embodiment, first portion $L_{5a}$ and the second portion $L_{5b}$ are disposed on the same metal layer, which may be an upper metal layer. Further, the center of the first portion $L_{5a}$ and the center of the second portion $L_{5b}$ may be coincident.

In this embodiment, both portions are created using a plurality of connected octagonal coils. The center of each portion may be defined as follows. A normal line may be drawn from the midpoint of each segment of each octagonal coil. The point at which all of these normal lines intersect is the center of the portion. The locations at which the octagonal coils are closest to the center may be referred to as the inner diameter. The locations at which the octagonal coils are furthest from the center may be referred to as the outer diameter.

In this embodiment, the second portion $L_{5b}$ is completely contained within the first portion $L_{5a}$. The outer diameter of the second portion $L_{5b}$ is less than the inner diameter of the first portion $L_{5a}$, such that the outer diameter of the second portion $L_{5b}$ is separated from the inner diameter of the first portion $L_{5a}$ by a separation distance 925. In certain embodiments, the separation distance 925 may be 10 μm or more. For example, in one embodiment, the second portion $L_{5b}$ has an inner diameter of 65 μm and an outer diameter of 120 μm, while $L_{5a}$ has an inner diameter of 145 μm and an outer diameter of 160 μm. This creates a separation distance 925 of nearly 12.5 μm. This separation distance 925 may be increased by increasing the inner diameter of the first portion $L_{5a}$, or by decreasing the outer diameter of the second portion $L_{5b}$. This separation distance 925 aids in decreasing the coupling coefficient. In some embodiments, the configuration shown in FIG. 9 may have a coupling coefficient of less than 0.5. In certain embodiments, the coupling coefficient may be less than 0.4. In certain embodiments, the coupling coefficient may be about 0.33.

Via 930 is used to connect the innermost coil of the first portion $L_{5a}$, which may be disposed on the upper metal layer, to the metal trace 940 disposed on a lower metal layer. $C_3$ is connected to via 930 using metal trace 940. In this embodiment, $C_3$ may also be disposed on the lower metal layer.

The innermost coil of the second portion $L_{5b}$ is connected to the shared node 903 using second metal trace 950, which is disposed on the lower metal layer. A second via 945 is used to connect the innermost coil of the second portion $L_{5b}$, which may be disposed on an upper metal layer, to the second metal trace 950. Capacitor $C_2$ is also connected to second metal trace 950.

A control circuit 970 may be in communication with $C_2$ and $C_3$. This control circuit 970 may be similar to that described with respect to FIG. 7.

Furthermore, while FIG. 9 shows the second portion $L_{5b}$ contained within the first portion $L_{5a}$, other embodiments are possible. For example, the first portion $L_{5a}$ may be contained within the second portion $L_{5b}$. To implement this configuration, the outermost coil (which is connected to the pad 905 in FIG. 9) would be connected to the shared node 903. Additionally, the innermost coil (which is connected to the shared node 903 in FIG. 9 using second metal trace 950) would be connected to the pad 905.

The embodiments shown in FIG. 7-9 may reduce the coupling coefficient from 0.56 (the value realized for the configuration shown in FIG. 5) to less than 0.4. In certain embodiments, the coupling coefficient may be reduced to less than 0.35. In some embodiments, the coupling coefficient may be reduced to less than 0.30. In yet other embodiments, the coupling coefficient may be reduced to less than 0.25.

The present system and method have many advantages. First, as compared to the impedance matching network shown in FIGS. 2-3, the present impedance matching networks reduces the required space by up to 50%. This may be critical within integrated circuits.

Second, referring back to the relationship between $C_3$ and $C_1$, it was determined that for a maximum value of $C_1$=0.634 pF, a center frequency of 2.45 GHz and a mutual inductance of 1.22 nH (based on a coupling coefficient of 0.56), the maximum value of $C_3$ would be 0.776 pF, a 22% increase over $C_1$. However, if the coupling coefficient is reduced to 0.3, the mutual inductance is reduced to 0.8 nH. Thus, the maximum value of $C_3$ is now 0.720 pF. This is only a 13.5% increase over $C_1$. Thus, the quality factor is greatly improved for the configurations shown in FIGS. 7 and 8, as compared to that shown in FIG. 5.

In summary, the configurations shown in FIG. 7-9 represent a compromise between best quality factor (achieved using two physically separate inductors) and smallest space (achieved using a single center tapped inductor). The configuration is 65% of the area used by the configuration shown in FIG. 3 and has a quality factor of the capacitor that is only 13.5% worse than that for the configuration shown in FIGS. 2-3.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An impedance matching network implemented using an integrated circuit, comprising:
   an inductor comprising a first portion disposed on a first metal layer of the integrated circuit and a second portion disposed on the first metal layer, wherein all of the second portion is contained within the first portion and separated from the first portion by a separation distance, wherein a second end of the first portion is connected to a first end of the second portion, wherein a first end of the first portion or a second end of the second portion is connected to a shared node;
   a first tunable capacitor connected to the second end of the first portion; and
   a second tunable capacitor connected to the shared node.

2. The impedance matching network of claim 1, wherein a coupling coefficient between the first portion and the second portion is less than 0.4.

3. The impedance matching network of claim 1, wherein a coupling coefficient between the first portion and the second portion is less than 0.35.

4. The impedance matching network of claim 1, wherein the first portion and the second portion comprise a plurality of connected octagonal coils.

5. The impedance matching network of claim 1, wherein the separation distance is at least 10 μm.

6. The impedance matching network of claim 1, wherein the first end of the first portion is connected to an antenna and the second end of the second portion is connected to the shared node.

7. A wireless transceiver comprising:
the impedance matching network of claim 6;
a low noise amplifier to receive signals from the antenna during a receive mode; and
a power amplifier to transmit signals to the antenna during a transmit mode, wherein the low noise amplifier and the power amplifier connect to the shared node.

8. The impedance matching network of claim 1, wherein the first end of the first portion is connected to the shared node and the second end of the second portion is connected to an antenna.

9. A wireless transceiver comprising:
the impedance matching network of claim 8;
a low noise amplifier to receive signals from the antenna during a receive mode; and
a power amplifier to transmit signals to the antenna during a transmit mode, wherein the low noise amplifier and the power amplifier connect to the shared node.

10. The impedance matching network of claim 1, wherein the first portion and the second portion comprise a plurality of connected octagonal coils, wherein the separation distance is defined as a distance between an inner diameter of the first portion to the outer diameter of the second portion.

\* \* \* \* \*